(12) United States Patent
Dong et al.

(10) Patent No.: US 7,052,956 B2
(45) Date of Patent: May 30, 2006

(54) METHOD FOR FORMING CAPACITOR OF SEMICONDUCTOR DEVICE

(75) Inventors: Cha Deok Dong, Kyoungki-do (KR); Il Keoun Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 158 days.

(21) Appl. No.: 10/887,602

(22) Filed: Jul. 9, 2004

(65) Prior Publication Data
US 2005/0095778 A1    May 5, 2005

(30) Foreign Application Priority Data
Oct. 31, 2003    (KR) ........................ 10-2003-0076585
Nov. 12, 2003    (KR) ........................ 10-2003-0079893

(51) Int. Cl.
*H01L 21/8242*    (2006.01)
(52) U.S. Cl. ...................................... 438/253; 438/978
(58) Field of Classification Search ................ 438/255, 438/978
See application file for complete search history.

(56) References Cited

U.S. PATENT DOCUMENTS

| 6,077,738 A * | 6/2000 | Lee et al. .................... 438/241 |
| 6,281,073 B1 * | 8/2001 | Lee ............................. 438/255 |
| 6,753,221 B1 * | 6/2004 | Jeon et al. ................... 438/253 |

* cited by examiner

*Primary Examiner*—Chandra Chaudhari
(74) *Attorney, Agent, or Firm*—Ladas & Parry LLP

(57) ABSTRACT

Disclosed is a method for manufacturing a capacitor of a semiconductor device. The method includes the steps of providing a substrate having a storage node plug, forming a PE-TEOS layer and a hard mask exposing a storage node contact area on the substrate, forming a storage node contact having a side profile of a positive and negative pattern through etching the PE-TEOS layer, removing the hard mask by etching-back the hard mask, performing an annealing process with respect to a resultant structure, forming a silicon layer on the silicon substrate, which passes through the annealing process, coating a photoresist film on an entire surface of the substrate, forming a storage node electrode by etching-back the photoresist film and the silicon layer, removing a remaining photoresist film, and forming a dielectric layer and a silicon layer on a storage node electrode structure.

22 Claims, 9 Drawing Sheets

Annealing process

Annealing process

METHOD FOR FORMING CAPACITOR OF SEMICONDUCTOR DEVICE

BACKGROUND OF THE INVENTION

1. Field of the Invention

The present invention relates to a method for forming a semiconductor device, and more particularly to a method for forming a capacitor of a semiconductor device capable of improving capacitance thereof.

2. Description of the Prior Art

Recently, a PSEUDO SRAM combining a DRAM with a SRAM has been developed. In such a PSEUDO SRAM, a capacitor identical to that of the DRAM is adopted in order to form a device. The capacitor stores electric charges, and provides the electric charges required for operating a semiconductor device. As semiconductor devices become highly integrated, a size of one unit cell becomes smaller so that capacitance required for operating the semiconductor devices is gradually increased.

That is, even though there is a demand for reducing a size of the capacitor as the semiconductor devices are highly integrated, there is a limitation on storage of the electric charges in the capacitor, so it is difficult to highly integrate the capacitor to match with a size of a cell. In order to solve the above-mentioned problem, manufacturers have proposed various structures for storing electric charges in the capacitor. For example, in order to increase the electric charges stored in the capacitor, various methods including a method using material having a high dielectric constant, a method reducing a thickness of dielectric material and a method increasing a surface area of the capacitor, have been proposed. Recently, a method increasing the surface area of a capacitor has mainly been used.

In order to increase the surface area of the capacitor, there has been suggested a method of increasing a height of the capacitor by using a PE-TEOS (Plasma Enhanced-Tetra Ethyl Ortho Silicate) layer.

FIG. 1 is a plan view showing a growth of a hemispherical grain formed in a normal cell block when a PE-TEOS layer is not subject to an annealing process.

In an SRAM having a peripheral area larger than a peripheral area of a DRAM, when the hemispherical grain is grown in order to increase the surface area of the capacitor, contaminating materials contained in a PE-TEOS layer, such as carbon, are diffused to an exterior, thereby interrupting growth of the hemispherical grain in the edge and the test pattern of the cell block, in which the PE-TEOS layer is largely distributed. Accordingly, it is difficult to increase the capacitance of the capacitor.

FIG. 2 is a plan view showing a growth of a hemispherical grain in an edge and a test pattern of a cell block when a PE-TEOS layer is not subject to an annealing process. As is understood from FIGS. 1 and 2, a size and a density of the hemispherical grain shown in FIG. 2 are inferior to a size and a density of the hemispherical grain shown in FIG. 1.

Accordingly, in order to solve the problem regarding the size and density of the hemispherical grain as shown in FIG. 2, after the PE-TEOS layer is formed, a storage node contact is formed by etching the PE-TEOS layer by using a hard mask. Then, the annealing process is carried out with respect to the resultant PE-TEOS layer. Thereafter, a storage node electrode filling the storage node contact, a dielectric layer, and a plate electrode are formed, thereby fabricating the capacitor.

If the annealing process is applied to the PE-TEOS layer in the manner as described above, capacitance uniformity is improved than capacitance uniformity obtained without performing the annealing process. Accordingly, mean capacitance is increased by about 2.7 F/cell. However, such a capacitance increase is insufficient when considering the growth of the hemispherical grain. That is, if the annealing process is carried out with respect to the PE-TEOS layer after forming the storage node contact, a shrinkage phenomenon of the PE-TEOS layer may occur so capacitance is insufficiently increased.

SUMMARY OF THE INVENTION

Accordingly, the present invention has been made to solve the above-mentioned problems occurring in the prior art, and an object of the present invention is to provide a method for forming a capacitor of a semiconductor, in which growth of a hemispherical grain is easily achieved without being interrupted by contaminating materials existing in a PE-TEOS layer forming a height of the capacitor.

Another aspect of the present invention is to provide a method for forming a capacitor of a semiconductor, capable of preventing a TEOS layer from being shrunk by performing an annealing process with respect to the TEOS layer before etching a storage node contact, and capable of obtaining sufficient capacitance by preventing capacitance loss resulting from a height reduction of a capacitor.

In order to accomplish this object, there is provided a method for manufacturing a capacitor of a semiconductor device, the method comprising the steps of: providing a semiconductor substrate having a storage node plug; sequentially forming a TEOS layer and a hard mask exposing a storage node contact area on the semiconductor substrate; forming a storage node contact having a side profile of a positive and negative pattern through etching the TEOS layer by using the hard mask; removing the hard mask by etching-back the hard mask while simultaneously removing a predetermined part of the storage node plug; performing an annealing process with respect to a resultant structure; forming a silicon layer on the silicon substrate, which passes through the annealing process; coating a photoresist film on an entire surface of the semiconductor substrate including the silicon layer; forming a storage node electrode of a capacitor by etching-back the photoresist film and the silicon layer; removing a remaining photoresist film; and sequentially forming a dielectric layer and a silicon layer for a plate electrode on a storage node electrode structure.

According to the preferred embodiment of the present invention, the TEOS layer includes PE-TEOS layer.

According to the preferred embodiment of the present invention, the TEOS layer is formed with a thickness of about 1500~2500 nm.

According to the preferred embodiment of the present invention, the annealing process is performed for 30~60 minutes in a furnace having a temperature of about 650~750° C. while providing $N_2$ gas into the furnace at a speed of 10~20 slm.

According to the preferred embodiment of the present invention, the silicon layer is formed by depositing an amorphous silicon layer doped with impurities, and an undoped amorphous silicon layer on the silicon substrate in-situ at a temperature of about 500~530° C. after the annealing process is carried out with respect to the silicon substrate.

According to the preferred embodiment of the present invention, the amorphous silicon layer doped with impurities, and the undoped amorphous silicon layer are formed in a ratio of 1:4 to 1:1.

According to the preferred embodiment of the present invention, impurities are doped into the amorphous silicon layer a rate of 1.5~2.5E21 atoms/cc.

BRIEF DESCRIPTION OF THE DRAWINGS

The above object, features and advantages of the present invention will be more apparent from the following detailed description taken in conjunction with the accompanying drawings, in which.

DETAILED DESCRIPTION OF THE PREFERRED EMBODIMENTS

Figure 1:
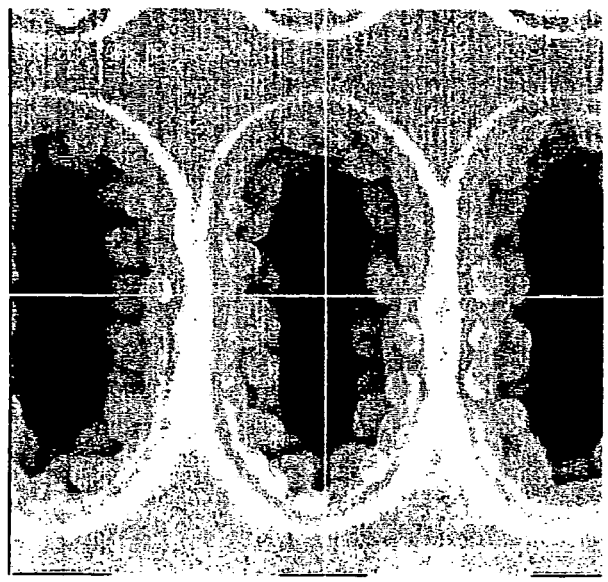
FIG. 1 is a plan view showing a growth of a hemispherical grain in a normal cell block when a PE-TEOS layer is not subject to an annealing process.
Figure 2:
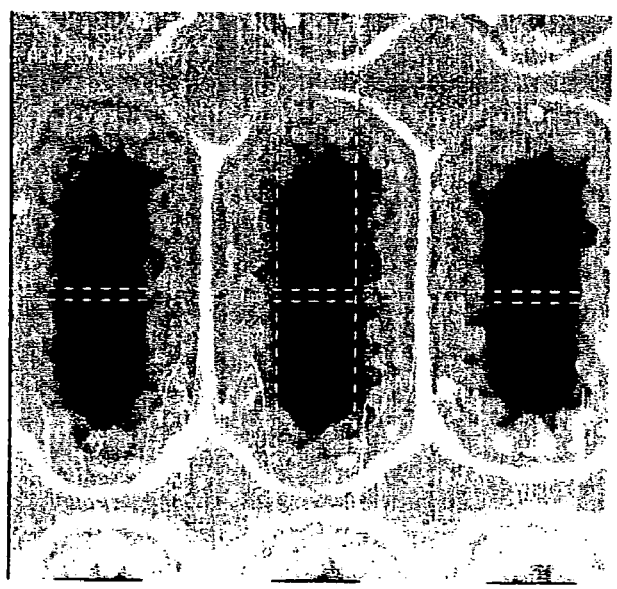
FIG. 2 is a plan view showing a growth of a hemispherical grain in an edge and a test pattern of a cell block when a PE-TEOS layer is not subject to an annealing process.

Hereinafter, a preferred embodiment of the present invention will be described with reference to the accompanying drawings. In the following description and drawings, the same reference numerals are used to designate the same or similar components, and so repetition of the description on the same or similar components will be omitted.

Hereinafter, a method for forming a capacitor of a semiconductor device according to one embodiment of the present invention will be explained with reference to FIGS. 3a to 3g.

FIGS. 3a to 3g are views showing a method for forming a capacitor of a semiconductor device according to one embodiment of the present invention.

FIGS. 3a to 3g are views showing a method for forming a capacitor of a semiconductor device according to another embodiment of the present invention.

Figure 3A:
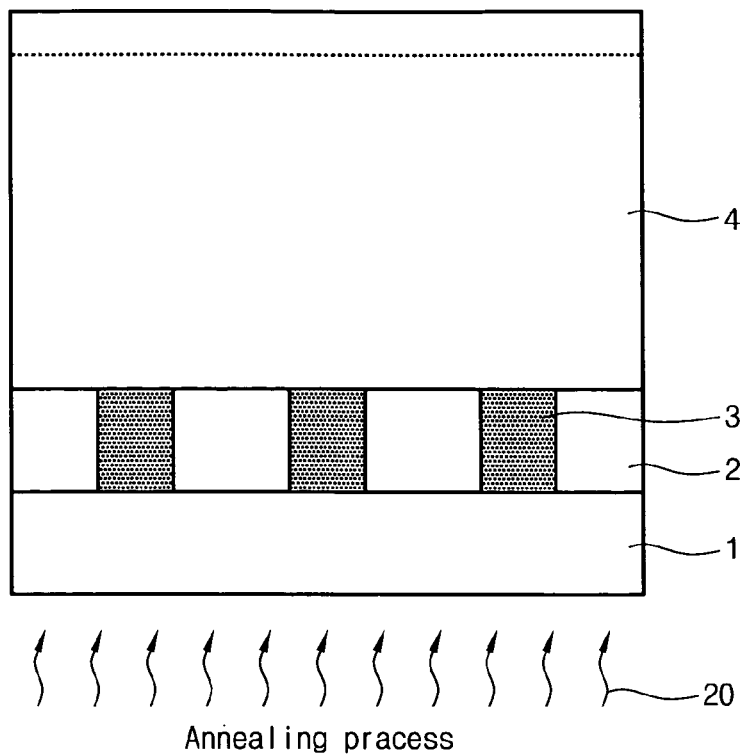
FIGS. 3a to 3g are views showing a method for forming a capacitor of a semiconductor device according to one embodiment of the present invention.

As shown in FIG. 3a, the method for forming the capacitor of the semiconductor device according to another embodiment of the present invention include a step of depositing a PE-TEOS layer 4 forming a height of the capacitor on a semiconductor substrate 1 including a bit line (not shown) and a storage node plug 3, at a thickness of about 1,500~2,500 nm. At this time, the PE-TEOS layer is over-deposited by about 7~10% with respect to a target. Then, an annealing process is carried out with respect to an entire surface of substrate including the PE-TEOS layer 4, so contaminating materials contained in a PE-TEOS layer, such as carbon, are diffused to an exterior. At this time, the annealing process 20 is performed for 30~60 minutes in a furnace having a temperature of about 650~750° C. while providing $N_2$ gas into the furnace at a speed of 10~20 slm. Accordingly, growth of a hemispherical grain can be easily achieved without being interrupted by the contaminating materials existing in the PE-TEOS layer.

Meanwhile, in FIG. 3a, a part shown with dotted lines in the PE-TEOS layer represents a shrinkage portion, which is shrunk by 10% from an original thickness caused by the annealing process. In addition, reference number 2 represents an insulating interlayer.

Figure 3B:
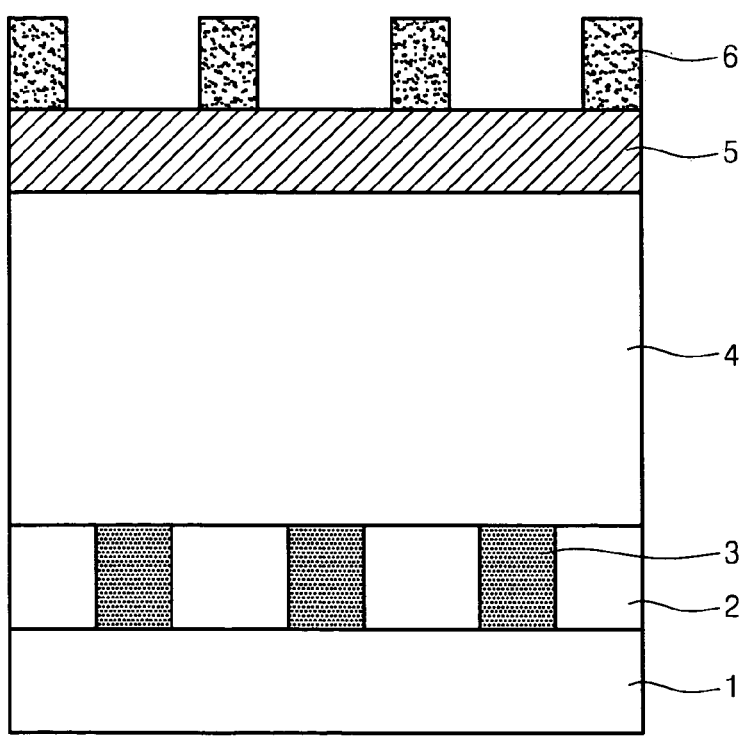

Thereafter, as shown in FIG. 3b, a polycrystalline silicon layer 5 for a hard mask is deposited on the PE-TEOS layer 4 with a thickness of about 250~500 nm. At this time, the storage node plug 3 is electrically connected to a source (not shown) or a drain (not shown) formed at a lower portion of the semiconductor substrate 1. Then, after coating a photoresist film (not shown) on the polycrystalline silicon layer 5, an exposure and development process is carried out, thereby forming a photoresist film pattern 6 exposing a storage node contact region (not shown).

Figure 3C:
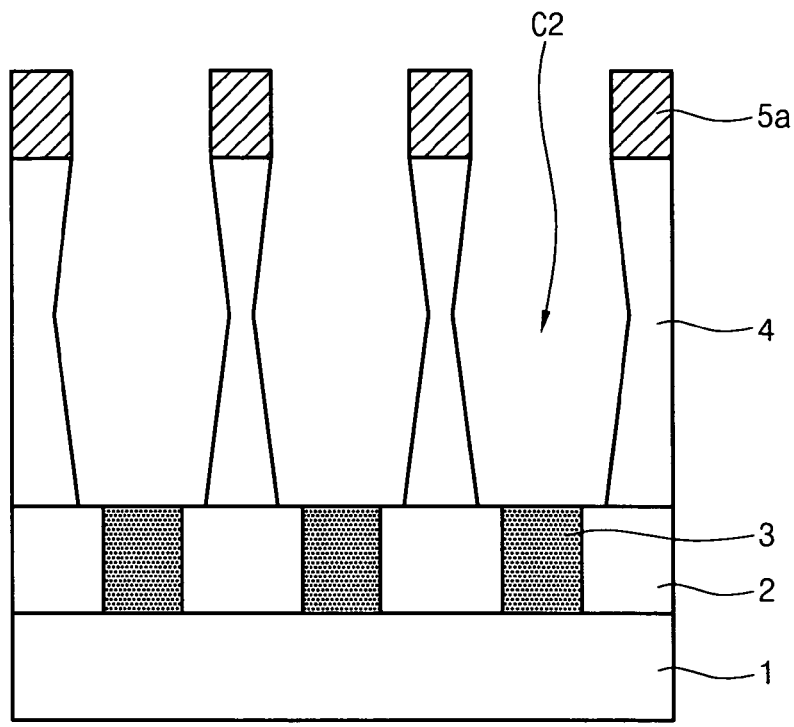

Then, as shown in FIG. 3c, the polycrystalline silicon layer is etched by using the photoresist film pattern as a mask, thereby forming a hard mask 5a. After that, the PE-TEOS layer is etched by using the hard mask 5a, thereby forming a storage node contact C2 exposing the storage node plug 3. At this time, the photoresist film pattern is removed while the above etching process is being carried out. In addition, a side profile of the storage node contact C2 may be formed with a positive and negative pattern by properly controlling the etching process.

Figure 3D:
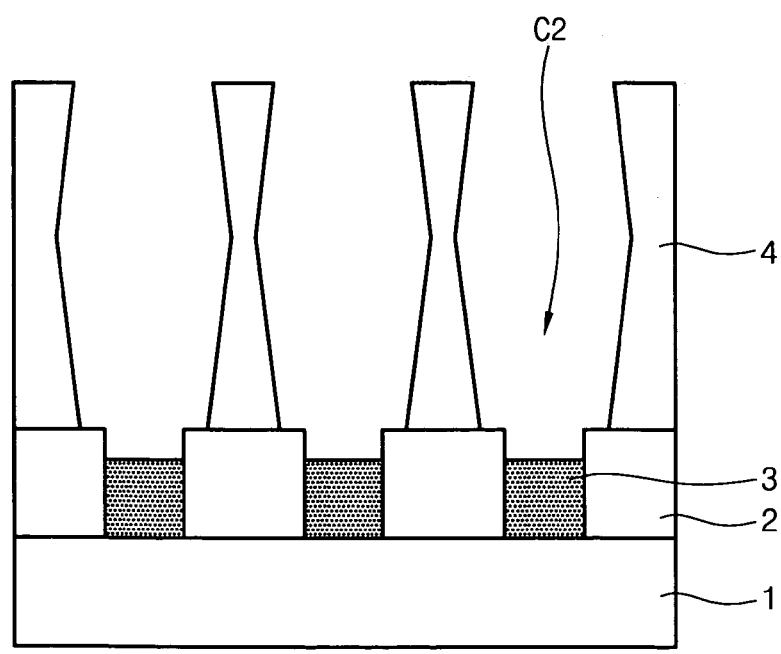

Thereafter, as shown in FIG. 3d, an etch-back process is carried out with respect to the PE-TEOS layer, thereby removing the hard mask. When the etch-back process is performed, the storage node plug 3 is removed by a predetermined thickness. As a result, a height of the capacitor (storage node contact) is increased.

Figure 3E:
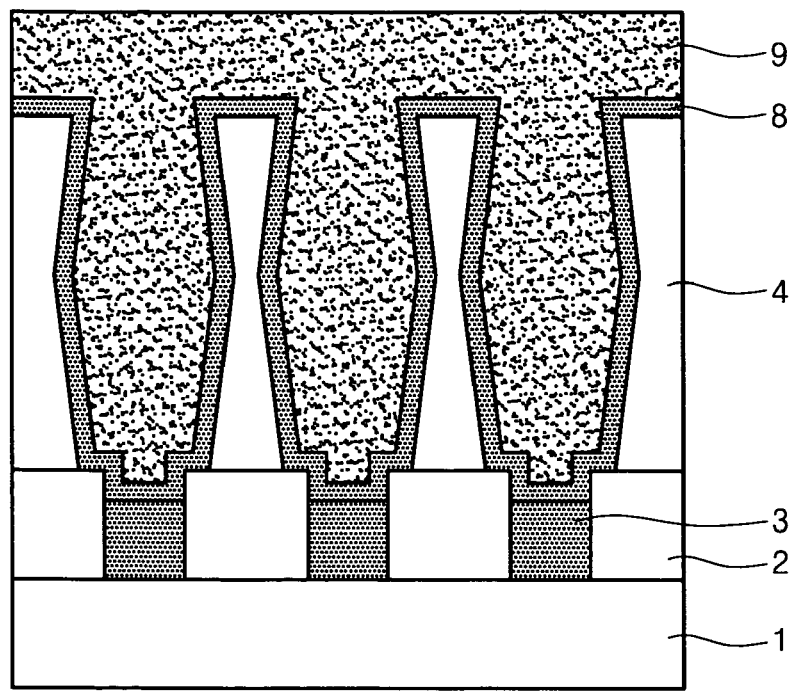

Then, as shown in FIG. 3e, a silicon layer 8 is deposited on an entire surface of the substrate, which has been subject to the annealing process. At this time, the silicon layer 8 is formed by depositing an amorphous silicon layer doped with impurities, and an undoped amorphous silicon layer in-situ at a temperature of about 500~530° C. In addition, the amorphous silicon layer doped with impurities, and the undoped amorphous silicon layer are formed in a ratio of 1:4 to 1:1. Herein, impurities are doped into the amorphous silicon layer in a rate of 1.5~2.5E21 atoms/cc. The impurities include phosphorous.

Thereafter, a photoresist film 9 is coated on an entire surface of the substrate including the amorphous silicon layer 8.

Figure 3F:
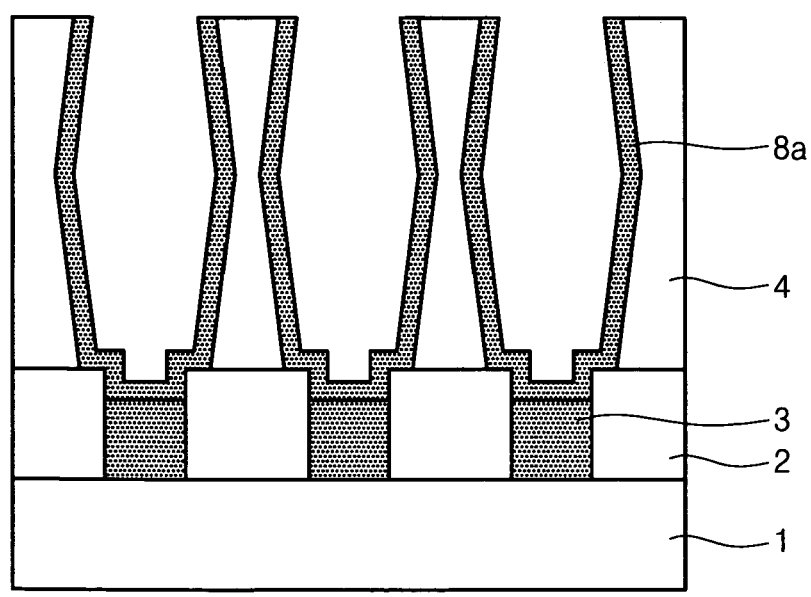

Then, as shown in FIG. 3f, an etch back process is performed with respect to the photoresist film and the silicon layer in order to individually separate the capacitors and to remove a remaining photoresist film. Reference number 8a represents the silicon layer remaining after the etch back process has been finished.

Figure 3G:
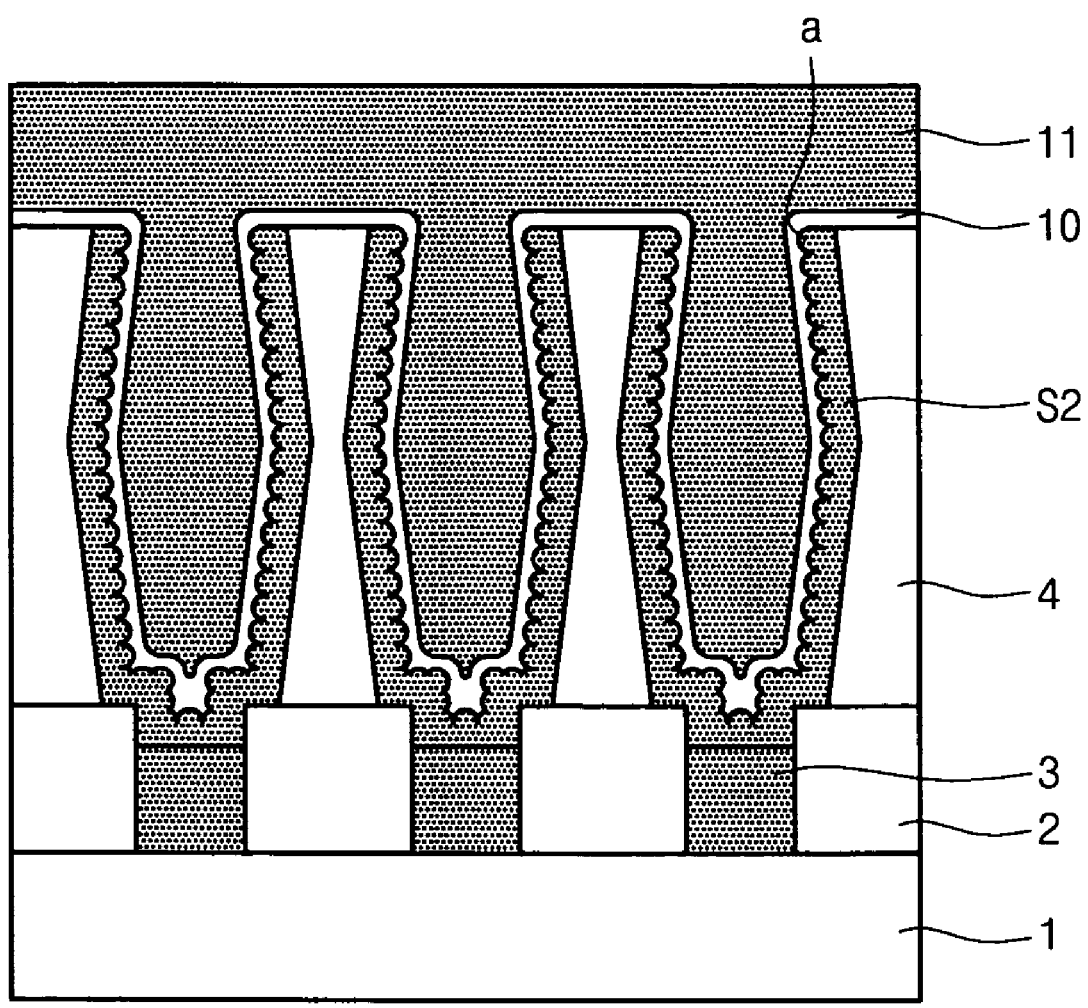

Then, as shown in FIG. 3g, a storage node electrode S2 of the capacitor is formed by growing a hemispherical grain a from the remaining amorphous silicon layer. Thereafter, a dielectric layer 10 and a polycrystalline silicon layer 11 for a plate electrode are sequentially formed on the storage node electrode S2, thereby fabricating the capacitor. At this time, even though it is not shown, a pre-treatment cleaning process can be carried out with respect to the substrate including the remaining amorphous silicon layer by using a mixture of $MH_4OH/H_2O_2/H_2O$ and DHF (dilute HF) liquid.

According to one embodiment of the present invention, after forming the PE-TEOS layer, an $N_2$ gas annealing process is carried out with respect to the PE-TEOS layer before performing a process for forming the storage node contact by etching the PE-TEOS layer, so contaminating materials contained in a PE-TEOS layer, such as carbon, are diffused to an exterior. Accordingly, a hemispherical grain is easily grown on a surface of the storage node electrode through next processes growing the hemispherical grain. In addition, a height of the capacitor is increased because the storage node plug is partially etched during the etch back process for removing the hard mask.

FIGS. 4a to 4g are views showing a method for forming a capacitor of a semiconductor device according to another embodiment of the present invention.

Figure 4A:
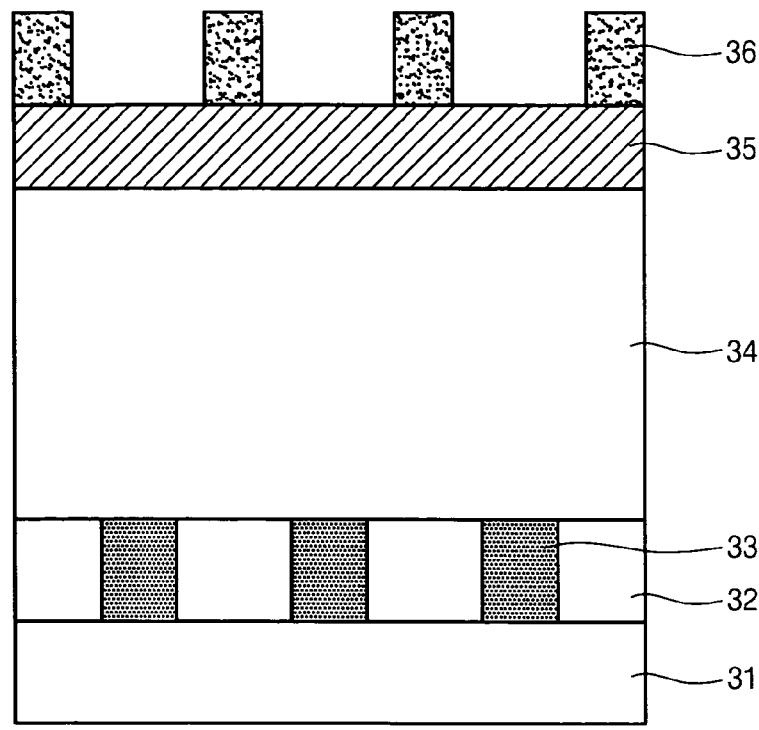
FIGS. 4a to 4g are views showing a method for forming a capacitor of a semiconductor device according to another embodiment of the present invention.

As shown in FIG. 4a, the method for forming the capacitor of the semiconductor device according to one embodiment of the present invention includes a step of depositing a PE-TEOS layer 34 forming a height of the capacitor on a substrate 31 including a storage node plug 33, at a thickness of about 1,500~2,500 nm. Thereafter, a polycrystalline silicon layer 35 for a hard mask is deposited on the PE-TEOS layer 34 with a thickness of about 250~500 nm. At this time, the storage node plug 33 is electrically connected to a source (not shown) or a drain (not shown) formed at a lower portion of the substrate 1. Reference number 32 is an insulating interlayer.

Then, after coating a photoresist film (not shown) on the polycrystalline silicon layer 35, an exposure and development process is carried out, thereby forming a photoresist film pattern 36 exposing a storage node contact region (not shown).

Figure 4B:
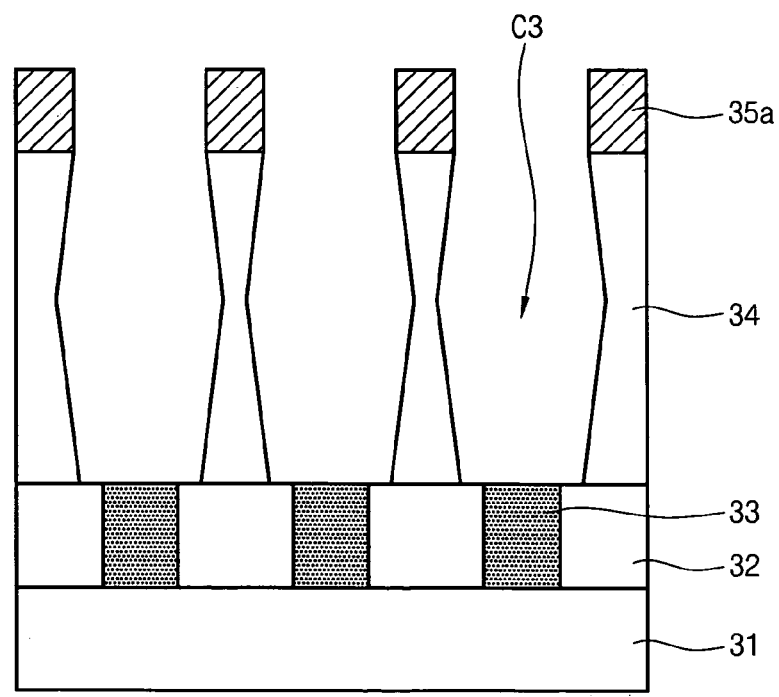

Then, as shown in FIG. 4b, the polycrystalline silicon layer is etched by using the photoresist film pattern as a mask, thereby forming a hard mask 35a. After that, the photoresist film pattern is removed. Subsequently, the PE-TEOS layer is etched by using the hard mask 35a, thereby forming a storage node contact C3 exposing the storage node plug 33. At this time, a side profile of the storage node contact C3 may be formed with a positive and negative pattern by properly controlling the etching process.

Figure 4C:
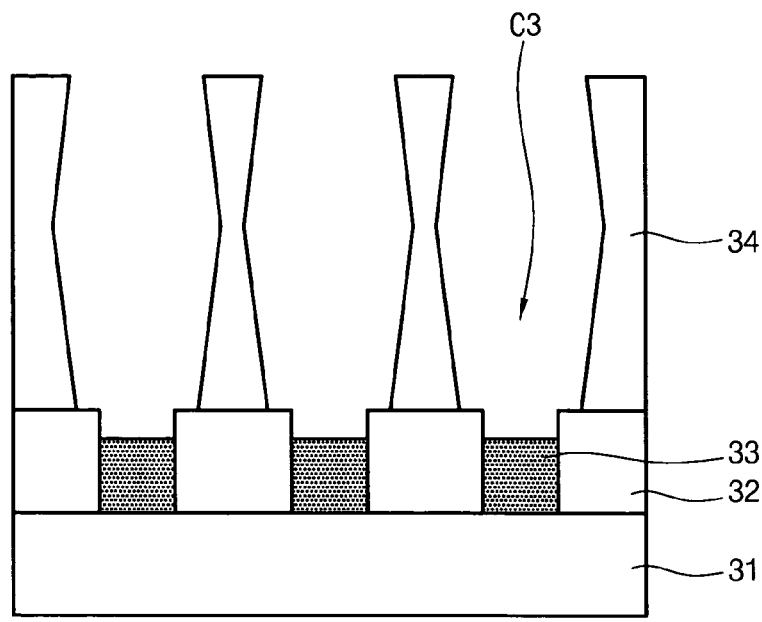

Thereafter, as shown in FIG. 4c, an etch-back process is carried out with respect to the PE-TEOS layer, thereby removing the hard mask. When the etch-back process is performed, the storage node plug is removed by a predetermined thickness. As a result, a height of the capacitor (storage node contact) is increased.

Figure 4D:
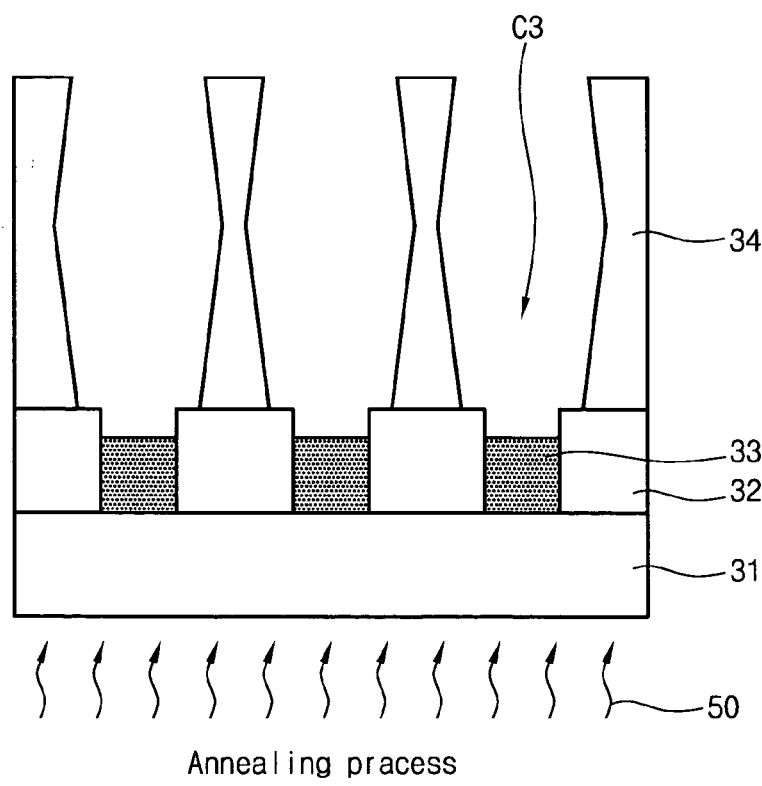

Then, as shown in FIG. 4d, an annealing process 50 is carried out with respect to a resultant structure by using $N_2$ gas, so contaminating materials contained in a PE-TEOS layer, such as carbon, are diffused to an exterior. Accordingly, growth of a hemispherical grain b can be easily achieved without being interrupted by the contaminating materials existing in the PE-TEOS layer.

At this time, the annealing process 50 is performed for 30~60 minutes in a furnace having a temperature of about 650~750° C. while providing $N_2$ gas into the furnace at a speed of 10~20 slm.

Figure 4E:
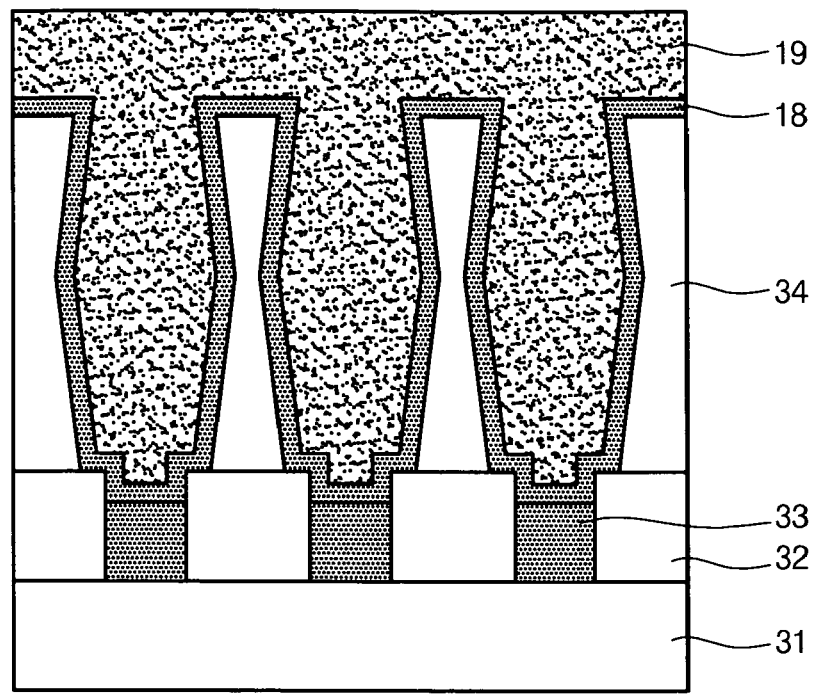

Then, as shown in FIG. 4e, a silicon layer 38 is deposited on an entire surface of substrate. the silicon layer 38 is formed by depositing an amorphous silicon layer doped with impurities, and an undoped amorphous silicon layer in-situ at a temperature of about 500~530° C. In addition, the amorphous silicon layer doped with impurities, and the undoped amorphous silicon layer are formed in a ratio of 1:4 to 1:1. Herein, impurities are doped into the amorphous silicon layer in a rate of 1.5~2.5E21 atoms/cc. The impurities include phosphorous.

Thereafter, a photoresist film 39 is coated on an entire surface of the substrate including the amorphous silicon layer 38.

Figure 4F:
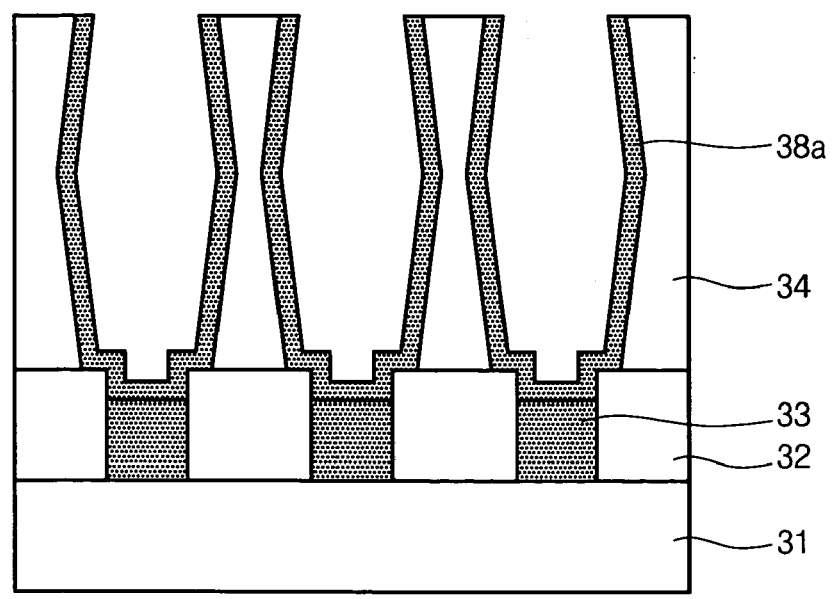

Then, as shown in FIG. 4f, an etch back process is performed with respect to the photoresist film and the silicon layer in order to individually separate the capacitor, and then, a remaining photoresist film is removed. Reference number 38a represents the silicon layer remaining after the etch back process has been finished.

Figure 4G:
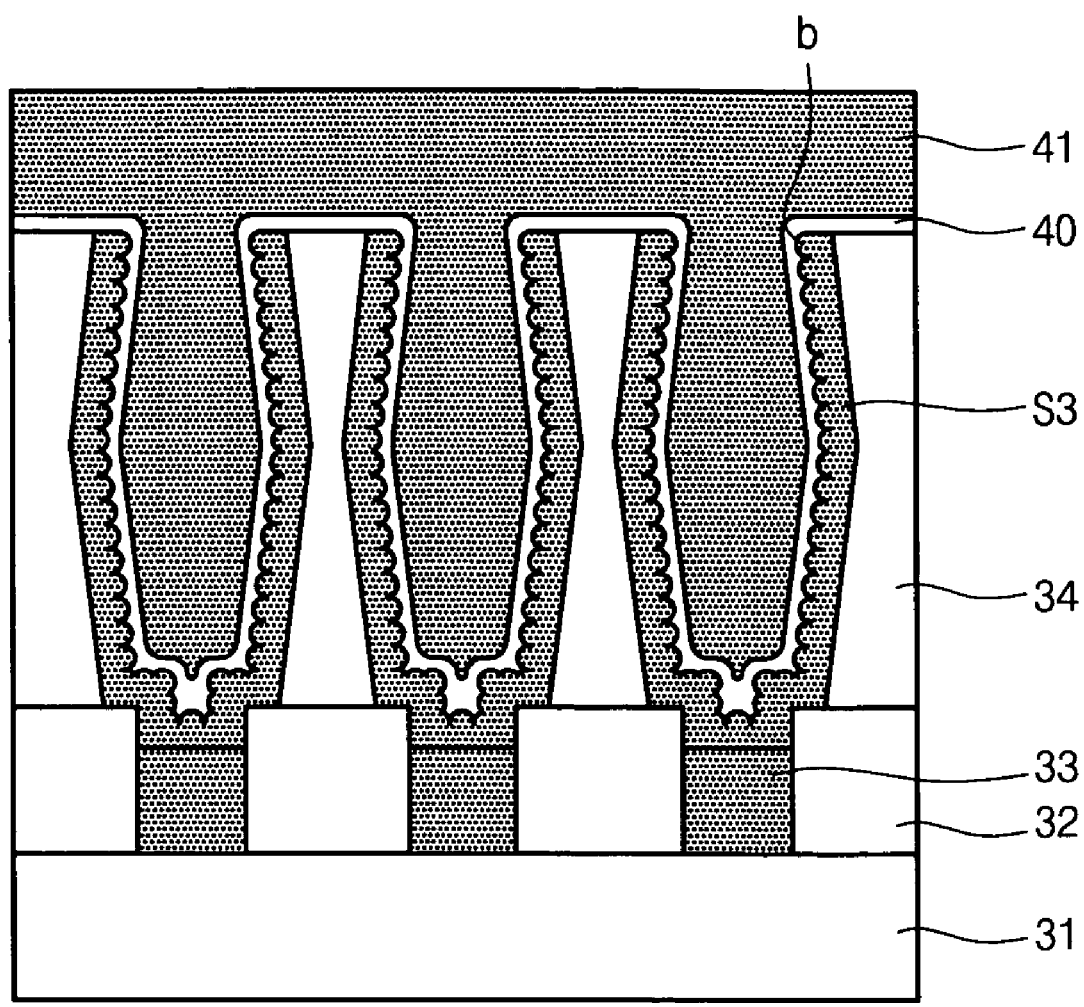

Then, as shown in FIG. 4g, a storage node electrode S3 of the capacitor is formed by growing a hemispherical grain b from the remaining amorphous silicon layer. Thereafter, a dielectric layer 40 and a polycrystalline silicon layer 41 for a plate electrode are sequentially formed on the storage node electrode S3, thereby fabricating the capacitor.

According to another embodiment of the present invention, contaminating materials existing in a PE-TEOS layer, such as carbon, are diffused to an exterior by performing an anneal process using $N_2$ gas. Thus, a hemispherical grain is easily grown through next processes. In addition, a height of the capacitor is increased because the storage node plug is partially etched during the etch back process for removing the hard mask.

As described above, when an etch back process is performed with respect to a hard mask, a storage node plug exposed by a storage node contact is removed by a predetermined thickness. Accordingly, a height of a capacitor is increased, so that capacitance of the capacitor is also increased.

In addition, according to the present invention, after forming a contact, an annealing process is carried out by using $N_2$ gas with respect to a PE-TEOS layer in order to diffuse contaminating materials, such as carbon, to an exterior. Accordingly, since such contaminating materials can be removed according to the present invention, the hemispherical grain can be easily grown from a surface of a storage node electrode through next processes, thereby increasing capacitance of the capacitor and improving a yield rate.

Meanwhile, according to the present invention, a PE-TEOS layer for increasing a height of a capacitor is over-deposited by about 7~10% with respect to a target and an annealing process is carried out by using $N_2$ gas with respect to the PE-TEOS layer in order to diffuse contaminating materials, such as carbon, to an exterior. Then, a process for forming a storage node contact is carried out by etching the PE-TEOS layer, which has been subject to the annealing process. Accordingly, a hemispherical grain is easily grown on a surface of the storage node electrode through next processes growing the hemispherical grain, thereby increasing capacitance of the capacitor and improving a yield rate.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a capacitor of a semiconductor device, the method comprising the steps of:
   i) providing a semiconductor substrate having a storage node plug;
   ii) sequentially forming a TEOS layer and a hard mask exposing a storage node contact area on the semiconductor substrate;
   iii) forming a storage node contact having a side profile of a positive and negative pattern through etching the TEOS layer by using the hard mask;
   iv) removing the hard mask by etching-back the hard mask while simultaneously removing a predetermined part of the storage node plug;
   v) performing an annealing process with respect to a resultant structure;
   vi) forming a silicon layer on the silicon substrate, which passes through the annealing process;
   vii) coating a photoresist film on an entire surface of the semiconductor substrate including the silicon layer;
   viii) forming a storage node electrode of a capacitor by etching-back the photoresist film and the silicon layer;

iX) removing a remaining photoresist film; and

X) sequentially forming a dielectric layer and a silicon layer for a plate electrode on a storage node electrode structure.

2. The method as claimed in claim 1, wherein the TEOS layer includes PE-TEOS layer.

3. The method as claimed in claim 1, wherein the TEOS layer is formed with a thickness of about 1500~2500 nm.

4. The method as claimed in claim 1, wherein the hard mask is formed with a thickness of about 250~500 nm.

5. The method as claimed in claim 1, wherein the annealing process is performed for 30~60 minutes in a furnace having a temperature of about 650~750° C. while providing $N_2$ gas into the furnace at a speed of 10~20 slm.

6. The method as claimed in claim 1, wherein the silicon layer is formed by depositing an amorphous silicon layer doped with impurities, and an undoped amorphous silicon layer on the silicon substrate in-situ at a temperature of about 500~530° C. after the annealing process is carried out with respect to the silicon substrate.

7. The method as claimed in claim 6, wherein the impurities include phosphorous.

8. The method as claimed in claim 6, wherein the amorphous silicon layer doped with impurities, and the undoped amorphous silicon layer are formed in a ratio of 1:4 to 1:1.

9. The method as claimed in claim 6, wherein the impurities are doped into the amorphous silicon layer in a rate of 1.5~2.5E21 atoms/cc.

10. A method for manufacturing a capacitor of a semiconductor device, the method comprising the steps of:
 i) providing a semiconductor substrate having a storage node plug;
 ii) depositing a TEOS layer on the semiconductor substrate for ensuring a height of the capacitor;
 iii) diffusing contaminating materials contained in the TEOS layer to an exterior by performing an annealing process with respect to the TEOS layer;
 iv) forming a hard mask exposing a storage node contact area on the TEOS layer, which passes through the annealing process;
 v) forming a storage node contact having a side profile of a positive and negative pattern through etching the TEOS layer by using the hard mask;
 vi) removing the hard mask by etching-back the hard mask;
 vii) forming a silicon layer on a resultant structure;
 viii) coating a photoresist film on an entire surface of the semiconductor substrate including the silicon layer;
 ix) forming a storage node electrode of a capacitor by etching-back the photoresist film and the silicon layer;
 x) removing a remaining photoresist film; and
 Xi) sequentially forming a dielectric layer and a silicon layer for a plate electrode on a storage node electrode structure.

11. The method as claimed in claim 10, wherein the TEOS layer includes PE-TEOS layer.

12. The method as claimed in claim 10, wherein the TEOS layer is over-deposited by about 7~10% with respect to a target.

13. The method as claimed in claim 10, wherein the TEOS layer is formed with a thickness of about 1500~2500 nm.

14. The method as claimed in claim 10, wherein the hard mask is formed with a thickness of about 250~500 nm.

15. The method as claimed in claim 10, wherein the annealing process is performed for 30~60 minutes in a furnace having a temperature of about 650~750° C. while providing $N_2$ gas into the furnace at a speed of 10~20 slm.

16. The method as claimed in claim 10, wherein the silicon layer is formed by depositing an amorphous silicon layer doped with impurities, and an undoped amorphous silicon layer on the resultant structure in-situ at a temperature of about 500~530° C. after the annealing process is carried out with respect to the silicon substrate.

17. The method as claimed in claim 16, wherein the impurities include phosphorous.

18. The method as claimed in claim 16, wherein the amorphous silicon layer doped with impurities, and the undoped amorphous silicon layer are formed in a ratio of 1:4 to 1:1.

19. The method as claimed in claim 16, wherein the impurities are doped into the amorphous silicon layer in a rate of 1.5~2.5E21 atoms/cc.

20. The method as claimed in claim 16, wherein the etch back process is carried out with respect to the hard mask until a predetermined part of a storage node plug is removed, thereby increasing a height of a capacitor.

21. The method as claimed in claim 10, further comprising a step of performing a pre-treatment cleaning process with respect to the substrate including the storage node electrode of the capacitor by using a mixture of MH4OH/ H2O2/H2O and DHF (dilute HF) liquid, after a remaining photoresist film is removed.

22. A method for manufacturing a capacitor of a semiconductor device, the method comprising the steps of:
 i) providing a semiconductor substrate having a storage node plug;
 ii) depositing a PE-TEOS layer on the semiconductor substrate;
 iii) forming a hard mask exposing a storage node contact area on the PE-TEOS layer;
 iv) forming a storage node contact having a side profile of a positive and negative pattern through etching the PE-TEOS layer by using the hard mask;
 v) removing the hard mask by etching-back the hard mask;
 vi) forming a silicon layer on a resultant structure;
 vii) coating a photoresist film on an entire surface of the semiconductor substrate including the silicon layer;
 viii) forming a storage node electrode of a capacitor by etching-back the photoresist film and the silicon layer;
 iv) removing a remaining photoresist film;
 v) sequentially forming a dielectric layer and a silicon layer for a plate electrode on a storage node electrode structure; and
 vi) performing an annealing process between step ii) and step iii) or after step v).

* * * * *